United States Patent
Sakurai et al.

(10) Patent No.: US 7,631,288 B2
(45) Date of Patent: Dec. 8, 2009

(54) OPTICAL PROXIMITY CORRECTION PERFORMED WITH RESPECT TO LIMITED AREA

(75) Inventors: Mitsuo Sakurai, Kawasaki (JP); Masahiko Minemura, Kawasaki (JP)

(73) Assignee: Fujitsu Microelectronics Limited, Tokyo (JP)

(*) Notice: Subject to any disclaimer, the term of this patent is extended or adjusted under 35 U.S.C. 154(b) by 267 days.

(21) Appl. No.: 11/357,118

(22) Filed: Feb. 21, 2006

(65) Prior Publication Data

US 2006/0190920 A1 Aug. 24, 2006

Related U.S. Application Data

(63) Continuation of application No. PCT/JP03/11219, filed on Sep. 2, 2003.

(51) Int. Cl.
G06F 17/50 (2006.01)
G03F 1/00 (2006.01)
G03C 5/00 (2006.01)
G06K 9/00 (2006.01)

(52) U.S. Cl. .................. 716/21; 430/5; 430/30; 382/144; 382/145

(58) Field of Classification Search .......... 430/5, 430/30; 716/21; 382/144–145
See application file for complete search history.

(56) References Cited

U.S. PATENT DOCUMENTS

| 5,553,273 | A | 9/1996 | Liebmann | |
|---|---|---|---|---|
| 6,168,891 | B1 | 1/2001 | Shibata | |
| 6,183,916 | B1 | 2/2001 | Kuo et al. | |
| 6,567,964 | B2 * | 5/2003 | Shin et al. | 716/8 |
| 7,000,215 | B2 * | 2/2006 | Nakano et al. | 716/19 |
| 7,107,573 | B2 * | 9/2006 | Yamazoe et al. | 716/21 |
| 2001/0004122 | A1 | 6/2001 | Ito | |
| 2002/0116686 | A1 * | 8/2002 | Shin et al. | 716/2 |
| 2003/0198872 | A1 * | 10/2003 | Yamazoe et al. | 430/5 |
| 2004/0009409 | A1 * | 1/2004 | Hwang et al. | 430/5 |
| 2004/0194050 | A1 * | 9/2004 | Hwang et al. | 716/19 |
| 2005/0009344 | A1 * | 1/2005 | Hwang et al. | 438/689 |
| 2005/0044522 | A1 * | 2/2005 | Maeda | 716/18 |
| 2005/0250022 | A1 * | 11/2005 | Kotani et al. | 430/5 |
| 2006/0245636 | A1 * | 11/2006 | Kitamura et al. | 382/149 |
| 2008/0216027 | A1 * | 9/2008 | White et al. | 716/4 |

FOREIGN PATENT DOCUMENTS

| JP | 9-292701 | 11/1997 |
|---|---|---|
| JP | 10-301255 | 11/1998 |
| JP | 2000-338646 | 12/2000 |
| JP | 2001-230250 | 8/2001 |
| JP | 2001-324796 | 11/2001 |

\* cited by examiner

*Primary Examiner*—Stacy A Whitmore
(74) *Attorney, Agent, or Firm*—Fujitsu Patent Center (57) ABSTRACT

A method of performing optical proximity effect correction includes defining a partial area of an entire area of a mask pattern, the mask pattern including a real pattern and a dummy pattern, and performing optical proximity effect correction only with respect to the partial area.

8 Claims, 7 Drawing Sheets

(12)  United States Patent

OPTICAL PROXIMITY CORRECTION PERFORMED WITH RESPECT TO LIMITED AREA

CROSS-REFERENCE TO RELATED APPLICATION

This is a continuation of International Application No. PCT/JP2003/011219, filed on Sep. 2, 2003, the entire contents of which are hereby incorporated by reference.

BACKGROUND OF THE INVENTION

1. Field of the Invention

The present invention generally relates to mask pattern data processing methods, processing programs, and processing systems for use in forming mask patterns, and particularly relates to a method, program, and system for performing optical proximity effect correction.

2. Description of the Related Art

In the manufacturing of semiconductor devise, a light transfer device is used to print the pattern shape of a mask pattern on a wafer. As the patterns of semiconductor devices are made increasingly finer, optical proximity effect may cause adjacent patterns to come in contact with each other, may cause a pattern to have rounded corners, or may cause lines to be broken due to thinning. In consideration of this, a correction process may be performed to form a pattern shape exactly as desired on a wafer by processing pattern data such as to cancel or alleviate deformation based on the estimation of anticipated pattern deformation. This process is referred to as an optical proximity effect correction (hereinafter referred to as optical proximity correction).

Optical proximity correction (OPC) generates an auxiliary pattern associated with mask pattern data in order to correct a pattern on a reticle to attain a desired on-wafer image. In related-art pattern correction methods, generally, rules are defied for patterns for use in correcting design data. Based on the rules of correction pattern generation, a correction pattern is generated with respect to design data or with respect to reticle pattern data.

Figure 1:
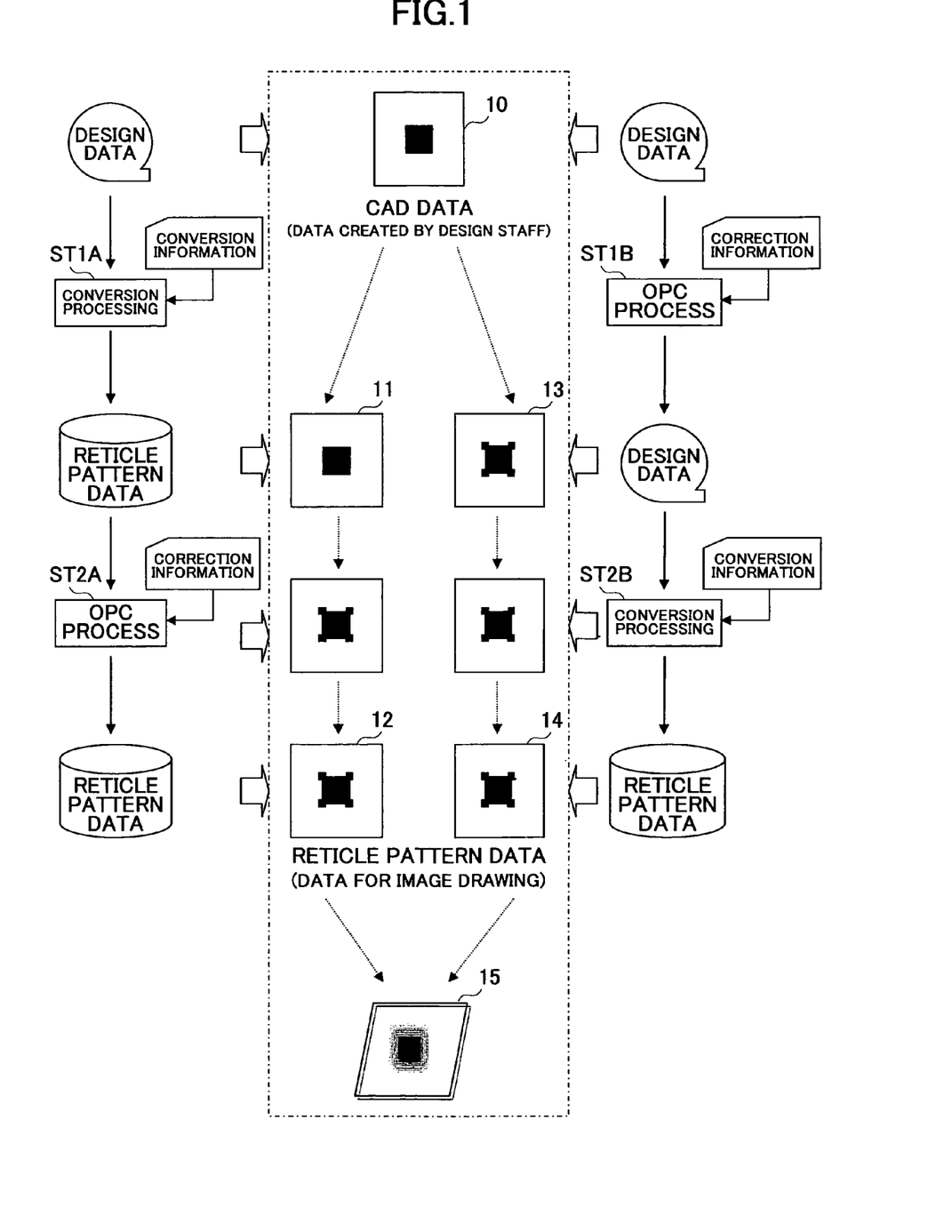
FIG. 1 is a drawing showing an outline of an optical proximity correction process.

FIG. 1 is a drawing showing an outline of an optical proximity correction process.

In FIG. 1, a process flow shown on the left-hand side of the drawing serves to generate an auxiliary pattern with respect to reticle pattern data. A process flow shown on the right-hand side of the drawing serves to generate an auxiliary pattern with respect to design data.

When an auxiliary pattern is to be generated with respect to reticle pattern data, reticle pattern data is generated at step ST1A by converting design data based on conversion information such as information indicative of a layer in which the pattern is located and sizing information about the size of the pattern. In this manner, reticle pattern data 11 is produced from CAD data 10 that is created by the design staff.

At step ST2A, optical proximity correction is applied to the reticle pattern data based on correction information, which includes optical proximity effect correction values indicative of the range affected by optical proximity effect, and defines the rules of optical proximity effect correction. In this manner, corrected reticle pattern data 12 is derived from the reticle pattern data 11. Image is drawn based on the corrected reticle pattern data 12, thereby generating a tangible reticle 15.

When an auxiliary pattern is to be generated with respect to design data, optical proximity correction is applied at step ST1B to design data based on correction information, which includes optical proximity effect correction values indicative of the range affected by optical proximity effect, and defines the rules of optical proximity effect correction. In this manner, corrected design data 13 is derived from the CAD data 10 that is created by the design staff.

At step ST2B, corrected reticle pattern data is generated by converting the corrected design data based on conversion information such as information indicative of a layer in which the pattern is located and sizing information about the size of the pattern. In this manner, corrected reticle pattern data 14 is generated from the corrected design data 13. Image is printed based on the corrected reticle pattern data 14, thereby generating the tangible reticle 15.

The optical proximity correction as described above is not only applied to the real wiring patterns of a semiconductor integrated circuit, but also applied to the dummy patterns.

When a semiconductor integrated circuit is manufactured, generally, significantly different wire densities at different points on the substrate make an optimal etching condition differ from point to point. This gives rise to a problem that the effect of the etching process is not homogeneous. As a result, at places where the wire density is small, resist may disappear to cause breaking of lines, and the width of lines may be narrowed to cause a significant increase in line resistance. In order to avoid such problems and perform etching that can form lines having respective thicknesses with desired precision, a ratio of resist pattern area size to wafer area size needs to be kept to a predetermined ratio. At the place where the size ratio of a wire pattern to a wafer area is small, thus, dummy patterns are inserted so as to achieve an approximately constant size ratio of resist patterns regardless of position on the wafer.

Figure 2:
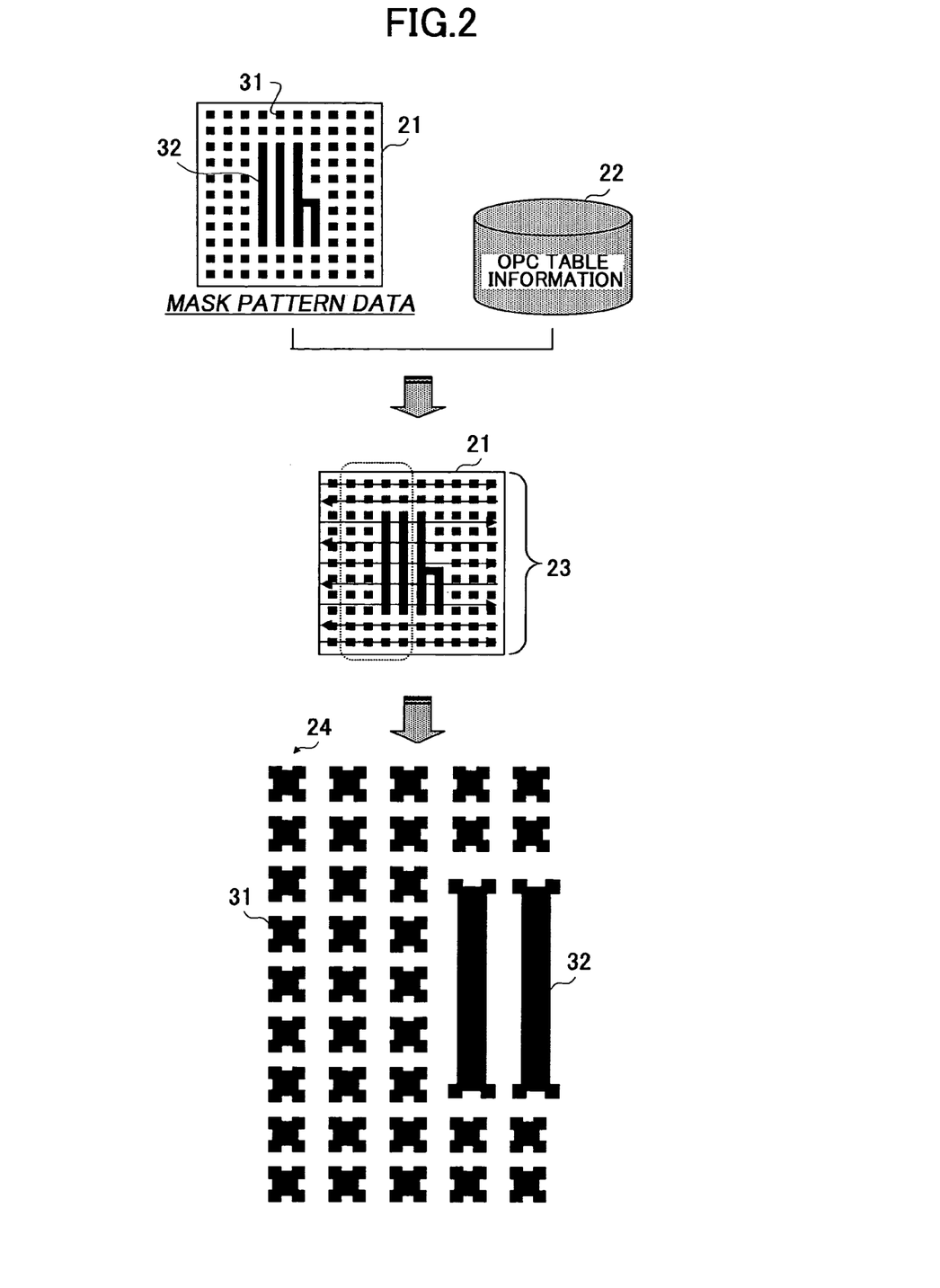
FIG. 2 is an illustrative drawing for explaining a related-art optical proximity correction that is performed when dummy patterns are present.

FIG. 2 is an illustrative drawing for explaining a related-art optical proximity correction that is performed when dummy patterns are present.

Mask pattern data 21 includes a main pattern 32 that corresponds to wires and the like and serves as a circuit, and also includes a dummy pattern 31 that is inserted for the purpose of adjusting etching conditions and the like and does not serve as a circuit. The dummy pattern 31 includes a plurality of rectangular patterns arranged to fill an empty area as shown in FIG. 2, for example. Optical proximity correction table information (OPC table information) 22 includes optical proximity effect correction values and the rules of correction pattern generation.

Based on the mask pattern data 21 and the optical proximity correction table information 22, optical proximity correction 23 is performed on the entirety of the mask pattern data 21. In so doing, the main pattern 32 and the dummy pattern 31 are not distinguished from each other, and the same optical proximity correction is applied to all the patterns. As a result, not only the main pattern 32 but also all the rectangular patterns constituting the dummy pattern 31 are corrected as illustrated in mask pattern data 24, which gives an expanded view of a portion of the mask pattern data 21. In this example, smaller rectangular patterns attached to, the corners of each pattern are intended to indicate that this pattern is a corrected pattern having undergone an optical proximity correction.

In this manner, the related-art optical proximity correction not only treats the main pattern corresponding to the portion that serves as a circuit, but also treats all the dummy patterns corresponding to portions that do not serve as a circuit. This gives rise to a problem that optical proximity correction is time-consuming. Further, when a correction pattern is attached to a dummy pattern (i.e., when the dummy pattern is corrected), the size of data that describes the pattern shape increases, which gives rise to a problem that the mask pattern data becomes larger.

Accordingly, there is a need for a method that can efficiently perform optical proximity correction with respect to mask pattern data including dummy patterns.

[Patent Document 1] Japanese Patent Application Publication No. 2001-230250

SUMMARY OF THE INVENTION

It is a general object of the present invention to provide an optical proximity correction method that substantially obviates one or more problems caused by the limitations and disadvantages of the related art.

It is another and more specific object of the present invention to provide a method that can efficiently perform optical proximity correction with respect to mask pattern data including dummy patterns.

In order to achieve the above objects, a method of performing optical proximity effect correction according to the present invention includes defining a partial area of an entire area of a mask pattern, the mask pattern including a real pattern and a dummy pattern, and performing optical proximity effect correction only with respect to said partial area.

According to the method described above, an area to which optical proximity effect correction is applied (or not applied) is defined, and optical proximity effect correction is performed only with respect to the area specified accordingly. With this provision, optical proximity effect correction is performed with respect to a limited area necessary to be corrected for optical proximity effect, such limited area including the real pattern that corresponds to a portion functioning as a circuit, and optical proximity effect correction is not applied to a portion of the dummy pattern that does not require optical proximity effect correction. This makes it possible to significantly shorten the time required for optical proximity effect correction. Further, the number of dummy patterns to be corrected is significantly reduced in comparison with the related-art configuration, thereby making it possible to reduce the size of data describing pattern shape and avoiding an increase in the mask pattern data.

According to another aspect of the present invention, mask pattern data includes a real pattern, and a dummy pattern, wherein the mask pattern data excluding at least a portion of the dummy pattern are patterns corrected for optical proximity effect.

In the mask pattern described above, optical proximity effect correction has been performed only with respect to a portion that requires optical proximity effect correction, including the real pattern that corresponds to a portion functioning as a circuit. Accordingly, the time required for optical proximity effect correction at the time of producing this mask pattern can be significantly shortened. Further, the number of corrected dummy patterns is significantly reduced in comparison with the related-art configuration, so that the mask pattern data has compact size, which does not require excessive memory space, and also makes it possible to shorten the time required to draw an image.

Further, the present invention provides mask pattern data in which optical proximity effect correction has been applied only with respect to a limited portion, a program for causing a computer to perform the steps of the method of performing optical proximity effect correction, and a system for performing optical proximity effect correction.

BRIEF DESCRIPTION OF THE DRAWINGS

Other objects and further features of the present invention will be apparent. from the following detailed description when read in conjunction with the accompanying. drawings, in which.

DESCRIPTION OF THE PREFERRED EMBODIMENTS

In the following, embodiments of the present invention will be described with reference to the accompanying drawings.

Figure 3:
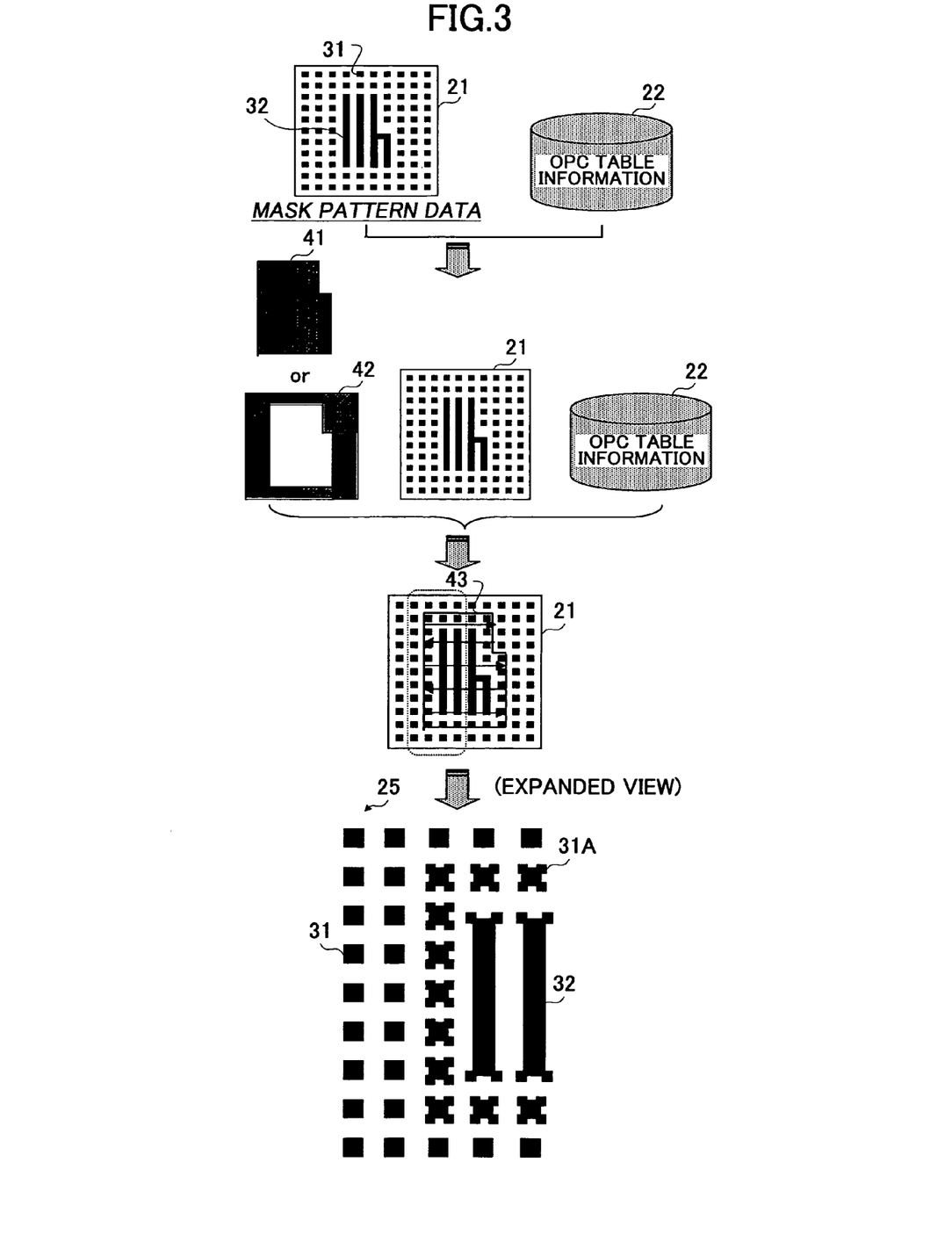
FIG. 3 is an illustrative drawing for explaining an optical proximity correction according to the present invention.

FIG. 3 is an illustrative drawing for explaining an optical proximity correction according to the present invention.

The mask pattern data 21 includes the main pattern (real pattern) 32 that corresponds to wires and the like and serves as a circuit, and also includes the dummy pattern 31 that is inserted for the purpose of adjusting etching conditions and the like and does not serve as a circuit. The dummy pattern 31 includes a plurality of rectangular patterns arranged in such a manner as to fill an empty area as shown in FIG. 3, for example. The optical proximity correction table information (OPC table information) 22 includes optical proximity effect correction values and the rules of correction pattern generation, according to which correction patterns are embodied.

Based on the mask pattern data 21 and the optical proximity correction table information 22, an optical proximity correction applied area 41 or an optical proximity correction prohibited area 42 is derived. How to derive these areas will be described later in detail. The optical proximity correction applied area 41 is data indicative of an area to which optical proximity correction is applied in the mask pattern data 21. The optical proximity correction prohibited area 42 is data indicative of an area to which optical proximity correction is not applied in the mask pattern data 21. Either the optical proximity correction applied area 41 or the optical proximity correction prohibited area 42 is used so that optical proximity correction is performed only with respect to a limited area in the mask pattern data 21.

Optical proximity correction 43 is performed with respect to a limited area in the mask pattern data 21 based on either the optical proximity correction applied area 41 or the optical proximity correction prohibited area 42, the mask pattern data 21, and the optical proximity correction table information 22. In so doing, the main pattern 32 and the dummy pattern 31 are not distinguished from each other in terms of the application of optical proximity correction, while the corrected area is limited according to the optical proximity correction applied area 41 or the optical proximity correction prohibited area 42. As a result, not only the main pattern 32 but also rectangular patterns 31A constituting some portion of the dummy pattern 31 are corrected as illustrated in mask pattern data 25, which gives an expanded view of a portion of the mask pattern data 21. In this example, smaller rectangular patterns attached to the corners of each pattern are intended to indicate that this pattern is a corrected pattern having undergone an optical proximity correction.

In the example shown in FIG. 3, optical proximity correction is performed with respect to a portion of the dummy pattern 31. However, this is not necessarily required. If the dummy pattern 31 is not included in the optical proximity correction applied area that is specified by the optical proximity correction applied area 41 or the optical proximity correction prohibited area 42, no correction will be applied to the dummy pattern 31. Namely, according to the present invention, an area in which optical proximity correction is performed (or an area in which optical proximity correction is not performed) is defined, and optical proximity correction is performed only with respect to the specified area. Whether or not a dummy pattern is included in the area to which optical proximity correction is applied is a matter of how to define the rules for generating the optical proximity correction applied area 41 or the optical proximity correction prohibited area 42.

Figure 4:
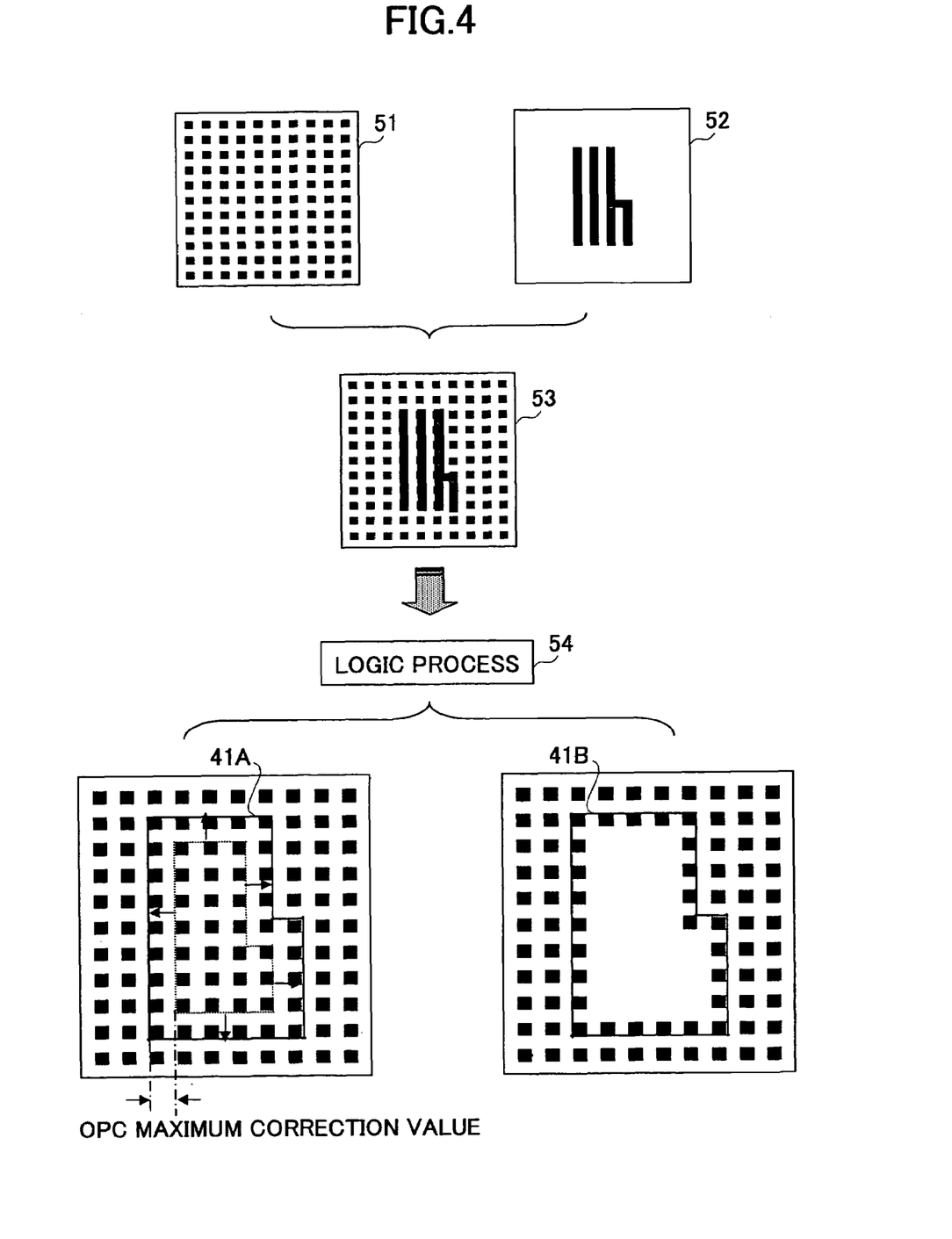
FIG. 4 is an illustrative drawing for explaining the process of generating an optical proximity correction applied area.

FIG. 4 is an illustrative drawing for explaining the process of generating an optical proximity correction applied area 41.

In order to generate dummy patterns around a main pattern in the mask pattern data, generally, dummy patterns that are evenly distributed over a given area is prepared in advance. Such dummy patterns are then superimposed on the main pattern, followed by removing an unnecessary part of the dummy patterns.

In FIG. 4, a dummy pattern 51 is comprised of rectangular patterns or the like that are evenly distributed such as to fill the entire area of the mask pattern. A main pattern 52 is comprised of patterns such as wire patterns that relate to the function of a circuit. The dummy pattern 51 and the main pattern 52 are superimposed on one another to generate a superimposed pattern 53. In the superimposed pattern 53, part of the dummy pattern 51 that overlaps the main pattern 52 is unnecessary, so that this part is removed from the data of the dummy pattern 51. In this manner, dummy patterns are generated around the main pattern.

A logic process 54 is then applied to the superimposed pattern 53 to generate an optical proximity correction applied area 41A or an optical proximity correction applied area 41B. As will be described later, the optical proximity correction applied area 41A and the optical proximity correction applied area 41B are different from each other in terms of how these patterns are generated.

In order to generate the optical proximity correction applied area 41A, a portion of the dummy pattern 51 that overlaps the main pattern 52 is removed, and the area where the dummy pattern is removed is identified. This identified area is then expanded outward by adding an optical proximity correction maximum correction value to the identified area. The optical proximity correction maximum correction value corresponds to the maximum reach of the area affected by optical proximity effect. This expanded area is the optical proximity correction applied area 41A. In the following, this method of generating an optical proximity correction applied area is referred to as a first generation method.

In order to generate the optical proximity correction applied area 41B, a portion of the dummy pattern 51 that overlaps the main pattern 52 is removed. Thereafter, locations that have no dummy pattern within a predetermined distance are searched for based on information indicative of the size and intervals of the dummy patterns, thereby identifying dummy patterns that are located at the outer periphery of the area from where the dummy patterns are removed. The optical proximity correction applied area 41B is defined by including these identified dummy patterns. In the following, this method of generating an optical proximity correction applied area is referred to as a second generation method.

Figure 5:
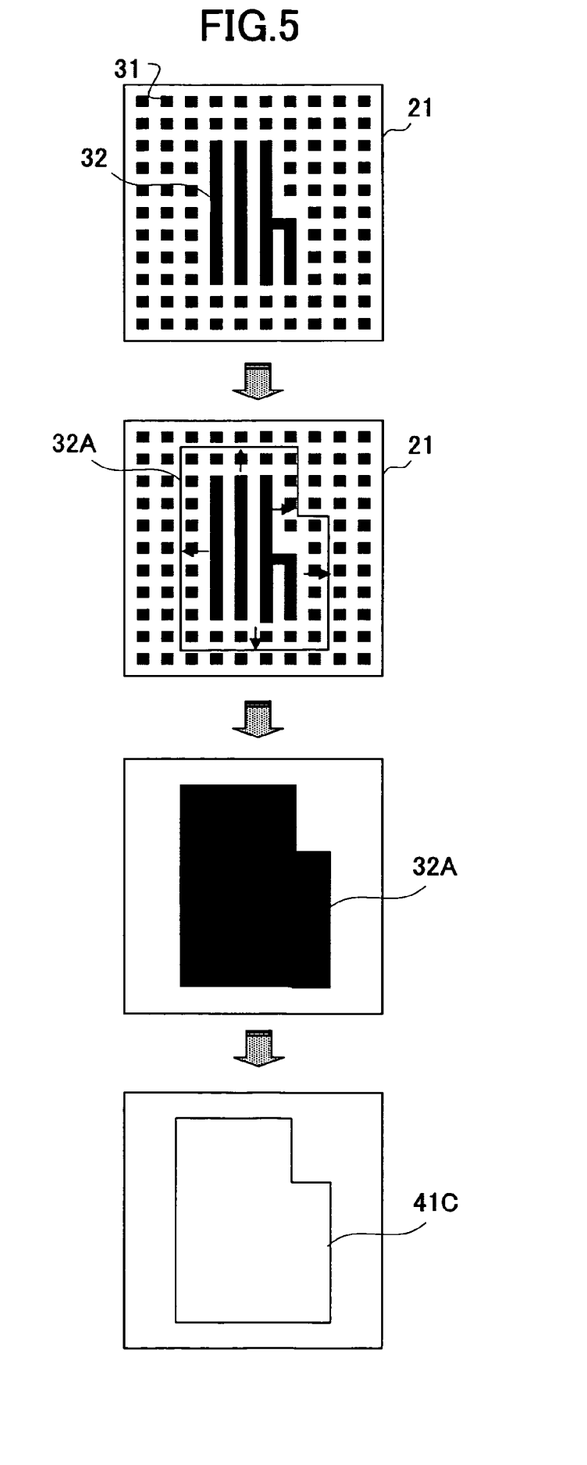
FIG. 5 is an illustrative drawing for explaining another process of generating an optical proximity correction applied area.

FIG. 5 is an illustrative drawing for explaining another process of generating an optical proximity correction applied area. The method of generating an optical proximity correction applied area shown in FIG. 5 will be referred to as a third generation method.

At the tope of FIG. 5, the mask pattern data 21 inclusive of the dummy pattern 31 and the main pattern 32 is illustrated. In the mask pattern data 21, a logic process that performs plus-sizing is applied to the main pattern 32, thereby expanding the pattern through thickening thereof. Specifically, a process that expands the pattern by an increment equal to the optical proximity correction maximum correction value may be performed, for example. Through this process, a plus-sizing-logic-process-applied main pattern 32A is obtained. At the end, an optical proximity correction applied area 41C is determined by identifying an area defined by the outermost periphery of the plus-sizing-logic-process-applied main pattern 32A.

Figure 6:
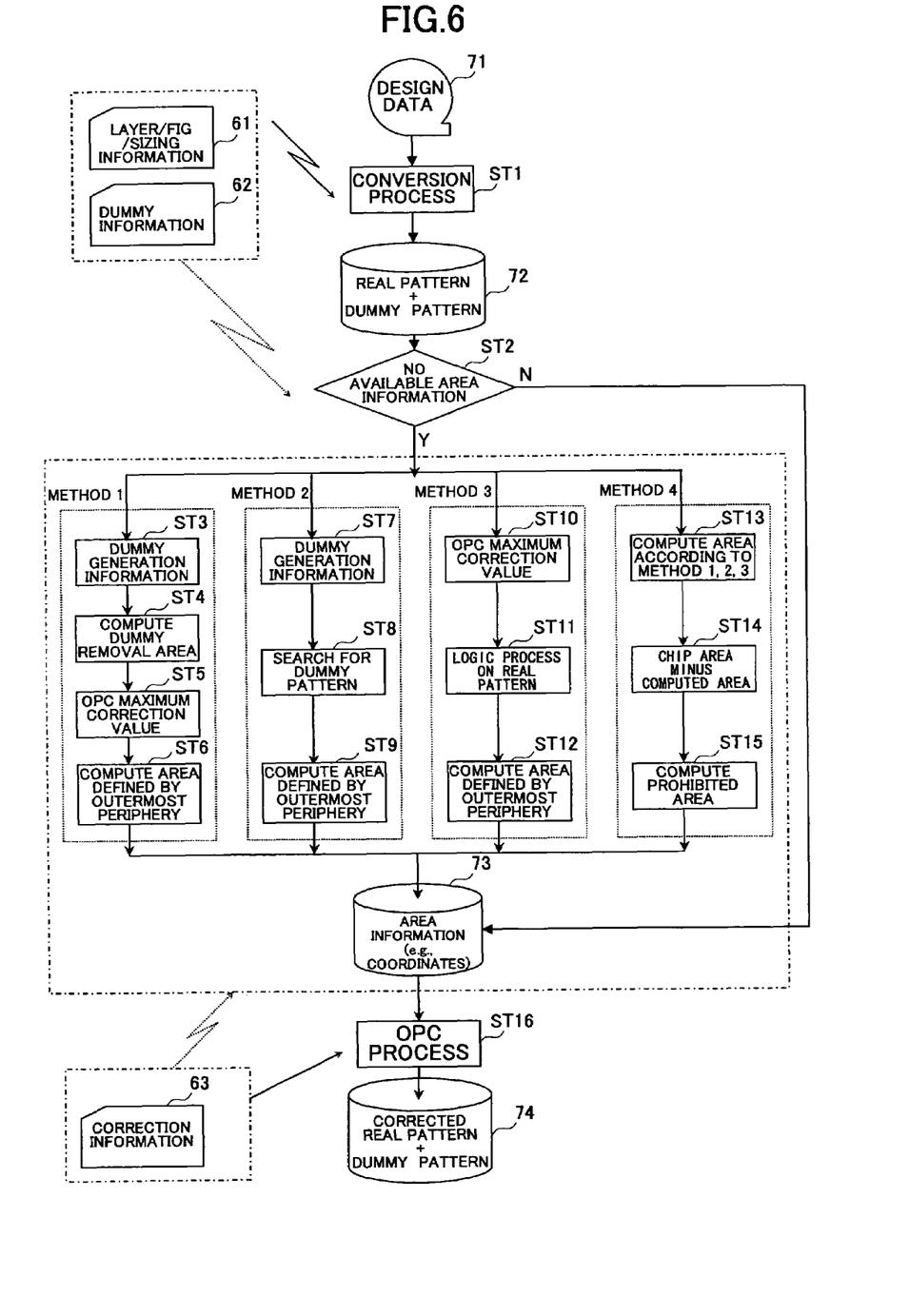
FIG. 6 is a flowchart showing an optical proximity correction according to the present invention.

FIG. 6 is a flowchart showing an optical proximity. correction according to the present invention.

At step ST1, a conversion process is applied to design data 71 based on conversion information, thereby generating real-pattern-and-dummy-pattern data 72 (reticle pattern data). The conversion information includes layer/Fig/sizing information 61 and dummy information 62. The layer/Fig/sizing information 61 includes layer information about a pattern layer, Fig information about a pattern, and sizing information about the size of a pattern. The dummy information 62 includes information indicative of positions where dummy patterns are generated and sizes of the dummy patterns.

At step ST2, a check is made as to whether area information is available. Here, the area information is information indicative of an area to which optical proximity correction is applied, such as the optical proximity correction applied area 41 or the optical proximity correction prohibited area 42. When area information is once extracted from mask pattern data, the extracted area information is stored in memory, thereby eliminating a need to extract the area information later again.

If step ST2 finds that area information is available, the procedure proceeds to step ST16. If it is ascertained that no area information is available, one of the first through third generation methods previously described or a fourth generation method will be performed in order to newly create area information.

If the first generation method is to be applied, the procedure proceeds from step ST2 to step ST3.

At step ST3, information about dummy generation is acquired. At step ST4, a removal area where dummy patterns are removed at places overlapping the real pattern (main pattern) is identified. At step ST5, an optical proximity correction maximum correction value is added to the removal area where dummy patterns are removed, thereby broadening and expanding the area. Here, the optical proximity correction maximum correction value is a maximum space value of the optical proximity correction defined by the correction rules stored in correction information 63. At step ST6, the outermost periphery of the expanded area is identified to produce the optical proximity correction applied area 41A.

If the second generation method is to be applied, the procedure proceeds from step ST2 to step ST7.

At step ST7, information about dummy generation is acquired. At step ST8, locations that have no dummy pattern within a predetermined distance are searched for based on information indicative of the size and intervals of the dummy patterns, thereby identifying dummy patterns that are located at the outer periphery of the area from where the dummy patterns are removed. At step ST9, the optical proximity correction applied area 41B is derived by determining the outermost periphery of the identified dummy patterns.

If the third generation method is to be applied, the procedure proceeds from step ST2 to step ST10.

At step ST10, an optical proximity correction maximum correction value indicative of a maximum space value of the optical proximity correction is obtained from the correction rules stored in the correction information 63. At step ST11, a logic process that performs plus-sizing is applied to the real pattern (main pattern), thereby expanding the pattern through thickening thereof by an increase equal to the optical proximity correction maximum correction value. Through this process, a plus-sizing-logic-process-applied real pattern is obtained. At step ST12, an optical proximity correction applied area 41C is determined by identifying an area defined by the outermost periphery of the plus-sizing-logic-process-applied real pattern.

If the fourth generation method is to be applied, the procedure proceeds from step ST2 to step ST13.

At step ST13, an optical proximity correction applied area is obtained by use of the first generation method, the second generation method, or the third generation method. At step ST14, the optical proximity correction applied area obtained at step ST13 is removed from the chip area. At step ST15, an optical proximity correction prohibited area is defined as the area that is left of the chip area after the optical proximity correction applied area is removed from the chip area.

According to one of the first through fourth generation methods described above, area information 73 is generated that defines an optical proximity correction applied area or optical proximity correction prohibited area by use of coordinates or the like.

At step ST16, optical proximity correction is performed with respect to the real-pattern-and-dummy-pattern data 72 within the area specified by the area information 73 according to the correction rules defined in the correction information 63. As a result, corrected real-pattern-and-dummy-pattern data 74 is obtained.

An actual reticle pattern is then created by drawing a pattern based on the corrected real-pattern-and-dummy-pattern data 74 obtained as described above.

The above embodiment has been described with reference to a case in which optical proximity correction is applied after the design data is converted into reticle data. As was described in connection with FIG. 1, optical proximity correction may alternatively be applied to the design data directly. In such a case, however, optical proximity correction is performed after dummy patterns are generated on the design data.

Figure 7:
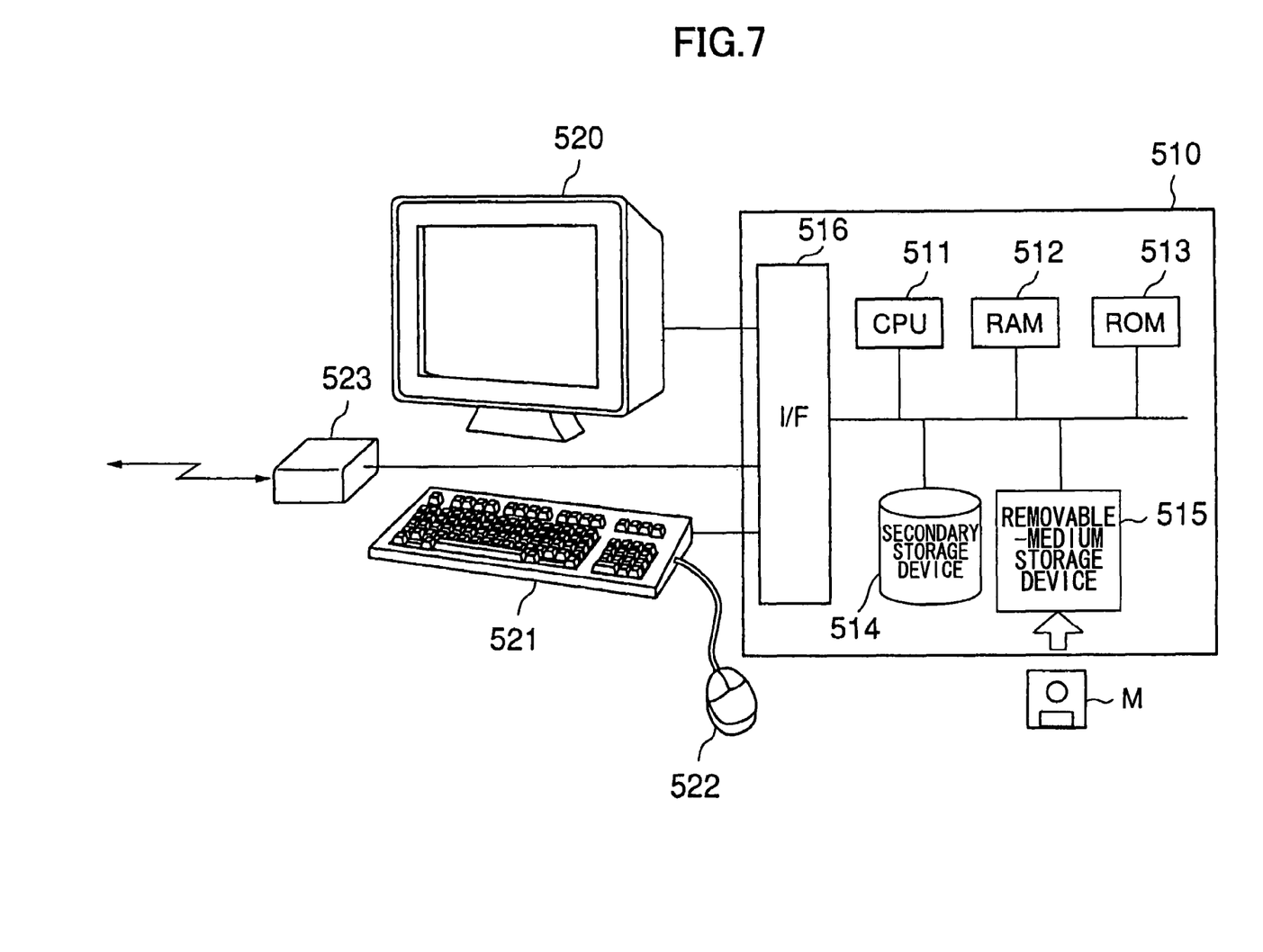
FIG. 7 is a block diagram showing the configuration of an apparatus for performing optical proximity correction according to the present invention.

FIG. 7 is a block diagram showing the configuration of an apparatus for performing optical proximity correction according to the present invention.

As shown in FIG. 7, an apparatus for performing optical proximity correction according to the present invention is implemented as a computer such as a personal computer, an engineering workstation, or the like. The apparatus of FIG. 7 includes a computer 510, a display apparatus 520 connected to the computer 510, a communication apparatus 523, and an input apparatus. The input apparatus includes a keyboard 521 and a mouse 522. The computer 510 includes a CPU 511, a ROM 513, a secondary storage device 514 such as a hard disk, a removable-medium storage device 515, and an interface 516.

The keyboard 521 and mouse 522 provide user interface, and receive various commands for operating the computer 510 and user responses responding to data requests or the like. The display apparatus 520 displays the results of processing by the computer 510, and further displays various data that makes it possible for the user to communicate with the computer 510. The communication apparatus 523 provides for communication to be conduced with a remote site, and may include a modem, a network interface, or the like The method of optical proximity correction according to the present invention is provided as a computer program executable by the computer 510. This computer program is stored in a memory medium M that is mountable to the removable-medium storage device 515. The computer program is loaded to the RAM 512 or to the secondary storage device 514 from the memory medium M through the removable-medium storage device 515. Alternatively, the computer program may be stored in a remote memory medium (not shown), and is loaded to the RAM 512 or to the secondary storage device 514 from the remote memory medium through the communication apparatus 523 and the interface 516.

Upon user instruction for program execution entered through the keyboard 521 and/or the mouse 522, the CPU 511 loads the program to the RAM 512 from the memory medium M, the remote memory medium, or the secondary storage device 514. The CPU 511 executes the program loaded to the RAM 512 by use of an available memory space of the RAM 512 as a work area, and continues processing while communicating with the user as such a need arises. The ROM 513 stores therein control programs for the purpose of controlling basic operations of the computer 510.

The execution of the computer program as described above achieves the performing of the optical proximity correction as described in the above embodiments. This computer environment for performing optical proximity correction is an optical proximity correction system or optical proximity correction apparatus.

Further, the present invention is not limited to these embodiments, but various variations and modifications may be made without departing from the scope of the present invention.

What is claimed is:

1. A method of performing optical proximity effect correction, comprising:

defining a partial area of an entire area of a mask pattern, the mask pattern including a real pattern and a dummy pattern;

performing optical proximity effect correction only with respect to said partial area by performing optical proximity effect correction with respect to the real pattern and a part of the dummy pattern included in the partial; and creating a tangible reticle pattern based on data indicative of the mask pattern.

2. The method as claimed in claim 1, wherein the step of defining a partial area determines the partial area based on information about the real pattern and information about the dummy pattern.

3. The method as claimed in claim 2, wherein the step of defining a partial area identifies, as the partial area, an area inclusive of the real pattern and part of the dummy pattern that is situated adjacent to the real pattern.

4. The method as claimed in claim 2, wherein the step of defining a partial area obtains the partial area by expanding an area from which a dummy pattern is removed at a place corresponding to the real pattern, said expanding being made according to a correction value of the optical proximity effect correction.

5. The method as claimed in claim 2, wherein the step of defining a partial area obtains the partial area by identifying part of the dummy pattern surrounding an area from which a dummy pattern is removed at a place corresponding to the real pattern, said part of the dummy pattern being obtained based on information indicative of arrangement of the dummy pattern.

6. The method as claimed in claim 2, wherein the step of defining a partial area obtains the partial area by expanding the real pattern through thickening thereof according to a correction value of the optical proximity effect correction.

7. A computer-readable medium having a program embodied therein for causing a computer to perform optical proximity effect correction, said program comprising program-code steps of:

defining a partial area of an entire area of a mask pattern, the mask pattern including a real pattern and a dummy pattern; and performing optical proximity effect correction with respect to said partial area by performing optical proximity effect correction with respect to the real pattern and a part of the dummy pattern included in the partial area.

8. A method of performing optical proximity effect correction, comprising:

separating an entire area of a mask pattern including a real pattern and a dummy pattern into a first area including the real pattern and only a part of the dummy pattern and a second area including at least a portion of the dummy pattern;

performing optical proximity effect correction only with respect to said first area by performing optical proximity effect correction with respect to the real pattern and only a part of the dummy pattern included in the first area; and creating a tangible reticle pattern based on data indicative of the mask pattern.

* * * * *